United States Patent
Yoo

(10) Patent No.: US 6,563,627 B2
(45) Date of Patent: May 13, 2003

(54) WAVELENGTH CONVERTER WITH MODULATED ABSORBER

(76) Inventor: Sung-Joo Ben Yoo, 635 Cleveland St., Davis, CA (US) 95616

( * ) Notice: Subject to any disclaimer, the term of this patent is extended or adjusted under 35 U.S.C. 154(b) by 192 days.

(21) Appl. No.: 09/828,004

(22) Filed: Apr. 6, 2001

(65) Prior Publication Data

US 2002/0186453 A1 Dec. 12, 2002

(51) Int. Cl.$^7$ .......................... G02F 2/02; G02F 1/365; H01S 5/026

(52) U.S. Cl. .......................... 359/326; 359/332; 372/44

(58) Field of Search ................................ 359/326–332; 372/43–46

(56) References Cited

U.S. PATENT DOCUMENTS

| 6,198,853 B1 | 3/2001 | Yamada | 385/2 |
| 6,208,454 B1 | 3/2001 | Koren et al. | 359/326 |

FOREIGN PATENT DOCUMENTS

| EP | 0 717 482 A1 | 6/1996 |
| WO | WO 01/24329 A1 | 4/2001 |

OTHER PUBLICATIONS

F. Ratovelomanana et al, "An All–Optical Wavelength–Converter with Semiconductor Optical Amplifiers Monolithically Integrated in an Asymmetric Passive Mach–Zehnder Interferometer", IEEE Photonics Technology Letters, vol. 7, No. 10, Oct. 1995, pp. 992–994.*

M. Dülk et al, "Efficient and robust regenerative all–optical wavelength converter for C– and L–band (80 nm span) and for data rates up to 40 Gbit/s", 2000 Conference on Lasers and Electro–Optics (Cleo 2000), San Francisco, May 7–12, 2000, pp. 276–277.*

S–C Cao et al, "Theoretical model of gain–saturated semiconductor optical amplifiers in cross–phase modulation wavelength converters", 2000 IEEE Lasers and Electro–Optics Society 13$^{th}$ Annual MTG (LEOS 2000), Rio Grande, PR, Nov. 13–16, 2000, pp 778–779.*

S.J.B. Yoo, "Wavelength conversion technologies for wdm network applications", *Journal of lightwave technology*, vol. 14, No. 6, Jun. 1996, pp. 955–966.

M. Foygel et al., "Sub–bandgap optical electro–absorption in the field of a p–n junction", *Phys. Stat. Sol.* (*b*), vol. 203, No. 255, 1997, pp. 255–264.

K. Satzke et al., "Absorption and elcroabsorption spectra of an $In_{1-x}GA_xP_{1-y}AS_y$/InP double heterostructure" *J. Appl. Phys.*, No. 63, vol. 11, Jun. 1, 1988, pp. 5485–5490.

D. Blumenthal, "Routing packets with light", *Scientific America*, Jan. 2001, pp. 96–99.

Ishikawa et al., "Wavelength conversion technologies for photonic network systems", *Fujitsu sci. tech. J.*, vol. 35, 126–138 pp., Jul. 1999.

Elmirghani et al., "All–optical wavelength conversion: technologies and applications in DWDM networks", *IEEE Communications Magazine*, 86–92 pp., Mar. 2000.

* cited by examiner

*Primary Examiner*—John D. Lee
(74) *Attorney, Agent, or Firm*—Charles S. Guenzer

(57) ABSTRACT

An optical wavelength converter, particularly useful in a wavelength-division multiplexing communication system, including a semiconductor junction in one arm of a Mach-Zehnder interferometer through which a data signal at a first wavelength and a probe signal at a second wavelength counter propagate. The junction is reversed biased into avalanche to selectively absorb the data signal and thereby phase modulate the probe signal according to the data impressed on the data signal. The phase modulated probe signal is beat against an unmodulated probe signal, thereby converting the wavelength of the optical carrier. A tunable laser may produce a probe signal of selectable wavelength. The data signal may first be converted by cross-gain modulation to a third wavelength out of band from the other signals before it is interacts with the probe signal.

27 Claims, 5 Drawing Sheets

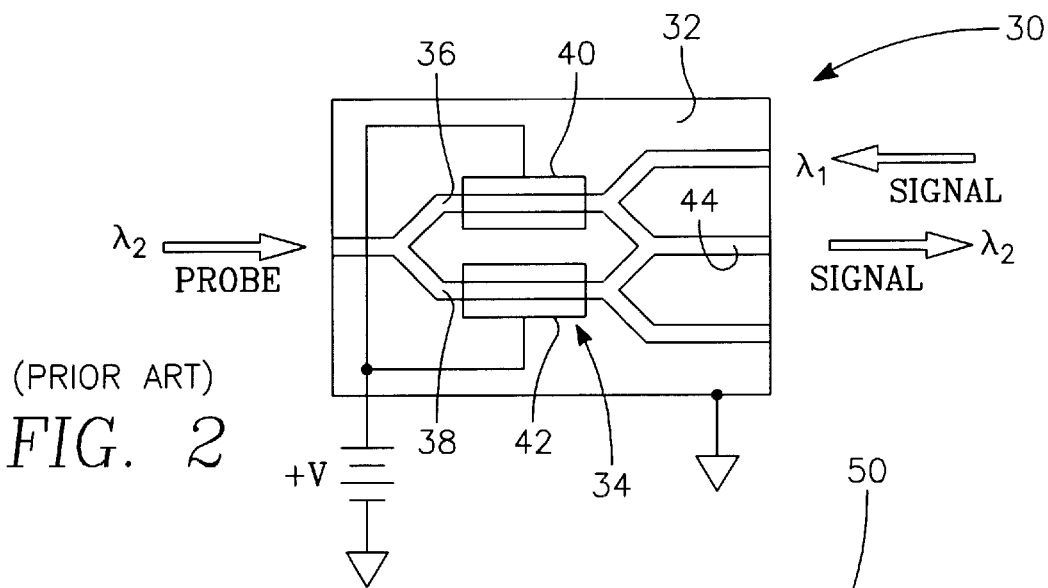
(PRIOR ART)
FIG. 2
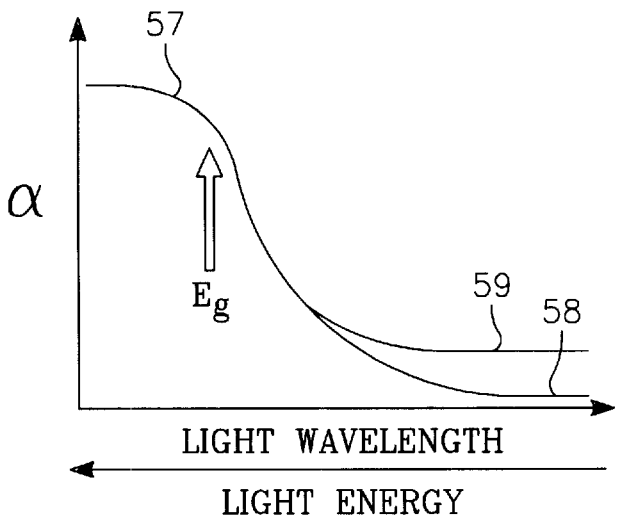
FIG. 3
FIG. 4

WAVELENGTH CONVERTER WITH MODULATED ABSORBER

BACKGROUND OF THE INVENTION

1. Field of the Invention

The invention relates generally to an optical wavelength converter. In particular, the invention relates to an optical wavelength converter incorporated into an optical switching element.

2. Background Art

Converting the wavelength of a light signal has always presented a challenge, particularly in optical communications systems in which an optical carrier is modulated with a data signal and it is desired to convert the wavelength of the optical carrier while maintaining the data signal without the need to convert to an intermediate electrical signal corresponding to the data.

Wavelength conversion has been suggested for greatly increasing the capacity and flexibility of switched optical networks. Wavelength division multiplexing (WDM) has long been known in which, for example, a silica optical fiber carries a number of discrete optical carriers in the 1525 to 1575 nm band, each impressed with its separate data signal. Electronic data signals are presently limited to about 10 to 40 gigabits per second (Gbs), but if these data rates are multiplied by the number W of WDM channels, where W is reaching 80 and higher, the total data capacity of a single fiber exceeds a terabit per second (Tbs). Such high data rates are anticipated to be needed as more visual forms of data begin to dominate the communications networks.

However, modem communication systems are based upon a complex network connected at its edges to users with typically many switching nodes separating a pair of users. A primary example is the Internet based upon the Internet Protocol (IP). Signals need to routed through the nodes of the network, which requires routers at the nodes to perform such selective routing. Heretofore, routers have been based on electronic switches, typically crossbars. As a result, WDM signals need to be optically demultiplexed, electrically detected, electrically switched, impressed upon respective optical carriers, and optically multiplexed before the components signals are sent in their respective proper directions. That is, regeneration of the optical signals needs to be performed with currently available routers. This design does not scale well with vastly increased optical channels.

All-optical WDM communication networks have been proposed in which wavelength cross connects (WXCs) located at nodes in the network redirect the separate WDM signals according to their wavelength. However, conventional WXCs require switching times that are much longer than the duration of packets typical of IP networks and other flexible communications networks. Further, WXCs maintain the carrier wavelength of the data signal so that using a wavelength identifier to route a signal between pairs of a number of users presents a significant network management problem for large networks in reusing wavelengths in different parts of the network.

Many of these problems can be overcome by the use of wavelength converters. In "Wavelength conversion technologies for WDM network applications, *Journal of Lightwave Technology*, vol 14, no. 6, June 1996, pp. 955–966, I have described some of the network applications for wavelength converters and different ways of implementing them. In U.S. Provisional Application, Ser. No. 60/185,640, filed Feb. 29, 2000 and in U.S. patent application Ser. No. 09/654,384, filed Sep. 1, 2000, I describe an optical router implemented with wavelength converters capable of throughput capacity of petabits per second ($10^{15}$ bits per second). This patent application is incorporated herein by reference in its entirety.

A switching fabric 10 illustrated in FIG. 1 can be used in such a high-speed optical router in which WDM signals on K input optical channels 12, typically optical fibers, are switched to any of K output optical channels 14. Optical demultiplexers 16 associated with each of the input fibers 12 separate the optical WDM signal into its W wavelength components. Input wavelength converters 18 convert the wavelength of the optical carriers on each of the demultiplexers outputs to a selected one of a number of wavelengths before these signals are input to a WK×WK wavelength router 20. Such a wavelength router 20 may be implemented as one or more array waveguide gratings (AWGs) and may be a passive device in which the switching direction of an input signal from any input port to any output port is determined completely by the carrier wavelength of the input signal as impressed by the input wavelength converters 18. Note that the size of the wavelength router 20 may be reduced if some limitations are imposed on the number of allowed switching paths. The output ports of the wavelength router 20 are connected to respective output wavelength converters 22 which freely convert the carrier wavelengths to new values determined by the WDM wavelength comb of the output channels 14. Optical multiplexers 24 receive W wavelength carriers and combines them onto associated optical output channels 14.

In order to achieve the capacity and flexibility of the optical router described in the aforecited patent application, the wavelength converters 18, 22 must be able to switch between any of the WDM wavelengths and should be able to do this in a time not much greater than the duration of the packet length, which in a typical design is a random length, for example 48 bytes or 1.5 kilobytes. Some signal delay is tolerated at the nodes, but it should be minimized for low signal latency on the network.

One type of wavelength converter applicable to optical switching is a gated wavelength converter, which may be implemented in a Mach-Zehnder interferometer converter 30, described briefly in my technical article cited above and illustrated in schematic plan view in FIG. 2. The converter 30 is integrated on, for example, an InP opto-electronic chip 32 formed with a Mach-Zehnder interferometer 34 having optical waveguides formed into two arms 36, 38. Forward biased optical semiconductor amplifiers (SOAs) are formed in active region 40, 42 of the both arms 36, 38. Forward biasing means that a positive voltage +V is applied to the p-type side of the semiconductor diode relative to the n-type side, which is typically grounded. All the illustrated waveguide, including that in the active regions 40, 42 is single-mode through the band of the optical carriers. An optical data signal at carrier wavelength $\lambda_1$ is input to a waveguide coupler at one end of the upper arm 36 configured to supply the data signal only to the upper arm 36. An unmodulated probe signal at wavelength $\lambda_2$ is input to another coupler at the other end of the upper arm 36. Note that the probe signal counter-propagates relative to the $\lambda_1$ data signal. That coupler divides the probe signal between the upper and lower arms 36, 38. The probe signal, after propagating through the two arms 36, 38 is recombined by the optical coupler on the left to an output waveguide 44.

The optical amplifiers in both arms 36, 38 are operated near or in optical saturation so that when the power of the on-state of the $\lambda_1$ optical data signal passes through the upper active region 40, it causes a change of phase relative to the lower active region 42, which does not experience the extra $\lambda_1$ signal power. In the off-state of the $\lambda_1$ optical data signal, there is no phase difference between the two active regions 40, 42. Sometimes differential biasing imposes a time-invariant phase difference between the two arms 40, 42. As a result of the induced temporally varying phase difference, the $\lambda_2$ probe signal will experience a phase differential in the two Mach-Zehnder arms 34, 36 depending upon the modulation state of the $\lambda_1$ optical data signal. The waveguide coupler at the end of the Mach-Zehnder interferometer opposite the $\lambda_2$ probe source receives both $\lambda_2$ signals and combines them onto the output waveguide 44. Depending upon the relative phase differences between the two arms, the two signals interference either constructively or destructively, thereby producing on the output waveguide 44 a $\lambda_2$ optical data signal of carrier frequency $\lambda_2$ modulated according the data signal originally carried on the $\lambda_1$ carrier.

This type of Mach-Zehnder wavelength converter, however, suffers several disadvantages. It consumes excessive amounts of electrical power, requiring about 300 mA of amplifier biasing current, approximately 500 mW of power. In view of the large number of wavelength converters required for a useful optical router, the large power presents powering problems and precludes integration of a significant number of converters on a single opto-electronic chip. Furthermore, the data rate of this type of wavelength converter is limited by the dynamics of the semiconductor amplifier, typically having a response time of 0.1 to 1 ns in typical InP opto-electronics. Accordingly, 10 Gbs single-channel data rates are at best marginal, and 40 Gbs rates are infeasible unless very high optical power of the order of 100 mW is used for the probe signal of the second wavelength.

Accordingly, an optical wavelength converter is needed which can convert carrier wavelengths while preserving their modulation and which converter consumes reduced levels of power. It is also desired that such a converter allow increased modulation rates of the converted optical signal.

SUMMARY OF THE INVENTION

An optical wavelength converter includes an interferometer having a semiconductor junction that is reversed biased. A first optical signal at a first wavelength is modulated according to a data signal and passes through the reversed biased junction as an unmodulated second optical signal at a second wavelength passes therethrough. The resultant second optical signal is combined with the unmodulated second optical signal to produce a second optical signal modulated according to said data signal. Preferably, the first and second optical signals counter-propagate through the reversed biased junction.

Preferably, the semiconductor junction has an optical band gap of a wavelength shorter than the first and second wavelengths. Preferably also, the semiconductor junction is reversed biased into avalanche with a multiplication factor, for example, of at least 10.

In one embodiment, the interferometer is a Mach-Zehnder interferometer having two arms, each with such a reversed biased semiconductor junction. The first optical signal passes through only one arm, and the second optical signal is split between both arms. The second optical signal is then recombined.

A semiconductor optical amplifier may amplify the first optical signal before it enters the interferometer.

A tunable diode laser may provide the second optical signal.

Either or both of the optical amplifier and the tunable diode laser may be integrated on the same opto-electronic chip as the interferometer and semiconductor junction. A plurality of sets of such elements may be integrated on the chip.

The optical input signal may first be converted to an intermediate signal at a fixed third wavelength which is then passed into the interferometer. Preferably, the third wavelength is shorter than either wavelength of the first and second optical signals. The initial wavelength conversion may be performed by cross-gain modulation.

Preferably, the interferometer is integrated on the same opto-electronic chip with some or all of the above described elements.

BRIEF DESCRIPTION OF THE DRAWINGS

FIG. 2 is a schematic of a Mach-Zehnder interferometric gated wavelength converter of the prior art.

FIG. 3 is a schematic of a Mach-Zehnder interferometric gated wavelength converter of the invention.

FIG. 4 is a graph illustrating the band gap tail of the optical absorption in a reversed biased semiconductor junction.

DETAILED DESCRIPTION OF THE PREFERRED EMBODIMENTS

Figure 1:
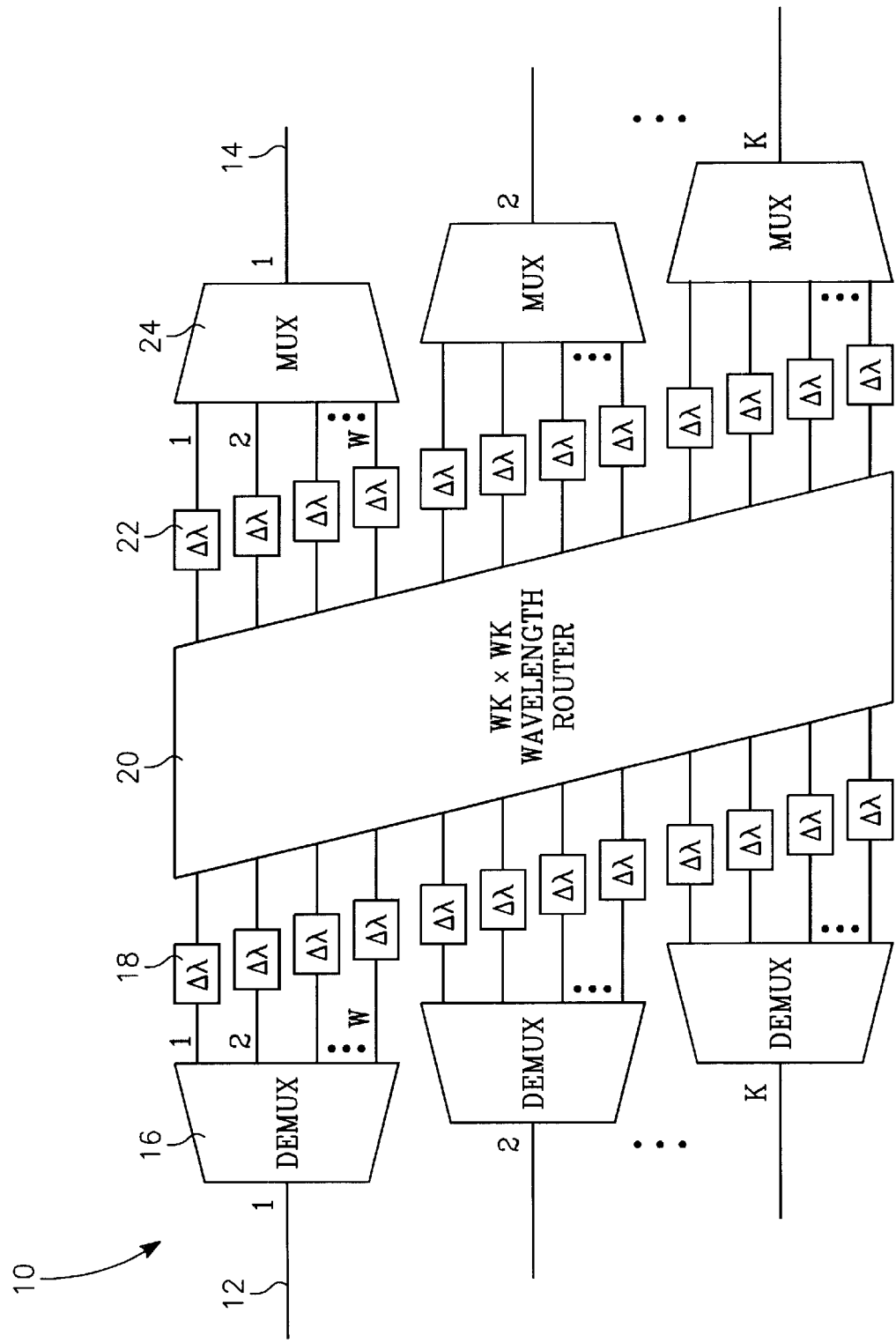
FIG. 1 is a schematic of the switching fabric of an optical router in which the wavelength converter of the invention may be advantageously used.

A wavelength converter 50 of the invention is illustrated in the schematic diagram of FIG. 3. It includes an Mach-Zehnder interferometer 52 similar to the interferometer 34 of the prior art. However, instead of amplifying active regions, it includes avalanche absorption regions 54, 56, which are negatively DC biased at $-V_1$ and $-V_2$. The two negative biases may differ by a few percent in order to, among other reasons, introduce a controlled constant phase difference between the arms. The avalanche absorption regions 54, 56 fundamentally differ from the amplifying active regions 40, 42 of FIG. 1.

A pn or pin structure or other semiconductor junction can be made to be an optical absorber of the type desired by biasing the p-type layer negatively with respect to the n-type layer. That is, the diode absorber is negatively biased in contrast to an amplifier being positively. When an diode junction unilluminated by light is reversed bias, there is very little current across the junction in the absence of light. A charge depletion zone forms between the reversed biased p- and n-type layers and will include the intrinsic, that is, i-type layer. However, when light passes through the depletion zone, photons are absorbed in the depletion zone to form electron-hole pairs, which diffuse to the layers biased so as to attract the differentially charged electrons and holes, thereby creating a photocurrent, not of direct interest for the invention.

The amount of absorption depends on the energy of the light photons, which is inversely proportional to the free-space wavelength of the light. To first order, there is no absorption for light having an energy less than the band gap $E_g$ of the material, here InGaAsP for which the band gap is chosen to lie somewhat close to the infrared band of about 1.55 μm. The band gap $E_g$ of a material is often measured by the photoluminescence wavelength. Indeed, the composition of ternary and quaternary III–V semiconductor materials is often specified by the photoluminesence wavelength rather than by the precise composition.

However, contrary to the simple band gap model, there is some optical absorption for light energy less the band gap. A typical plot 57 of absorption constant a versus optical wavelength (inverse of photon energy) is plotted in FIG. 4 for relatively small bias applied across the junction. The absorption length is the inverse of the absorption constant, that is, $1/\alpha$. For light with energy less than $E_g$ (longer wavelength), there is relatively little absorption since the light fails to have sufficient energy to excite an electron or hole across the band gap. However, there is some absorption. Several mechanisms account for a high-energy absorption tail 58 extending into the band gap, usually modeled as an exponential tail. Foygel et al. in "Sub-band gap optical electro-absorption in the filed of a p-n junction," *Physica Status Solidi* (b), vol. 203, pp. 255–264, 1977 ascribe the exponential tail to the Franz-Keldysh effect in a biased junction involving electron tunneling through part of the triangularly shaped biased potential profile. On the other hand, Satske et al. in "Absorption and electroabsorption spectra of an $In_{1-x}Ga_xP_{1-y}As_y$/InP double heterostructure," *Journal of Applied Physics*, vol. 63, no. 11, Jun. 1, 1988, pp. 5485–5490 ascribe the tail to excitons.

However, if the junction is strongly reversed biased, the depletion zone is wide and the electric field within the depletion zone is high. As a result, the electron and hole created by one photon as they are attracted to their respective p- and n-type layers are each likely to gain sufficient energy to collide with electrons or holes bound to atoms in the lattice create to ionize the atom and create additional electrons and holes. At sufficiently high bias, the effect multiplies to create a large number of electron-hole pairs for each photon, the large number being called the multiplication factor M. Exemplary values of the multiplication factor useful with the invention are M between 20 and 100. Because the avalanching electrons and holes tend to multiply with a broad range of energies, separated by an equally broad range of photon-interaction energies, the exponential tail 58 is converted in conditions of avalanche to a flattened tail region 59 of increased absorption that is relatively constant with light energy or wavelength.

Preferably, the absorption regions 54, 56 of the wavelength converter 50 of the invention are operated in the flattened tail region 59. In avalanche conditions with a reasonably high multiplication factor, there can be a significant effect on the index of refraction producing a phase change in passing light because of the high free charge density without the absorption also decreasing the level of the probe power to the point that there is no significant output signal. The absorption over the length of the absorption regions 54, 56 need be no greater than 20% so that relatively low pump power is needed to produce a converted optical signal of almost the same power. An advantage of operating in the absorption mode rather than the saturated amplification mode of FIG. 2 is the decreased switching times allowing increased data rates on optical signals being wavelength converted. Depending upon the design of the waveguide and the bias voltage, the response time of the reversed biased avalanche diode is typically in the range of 10 to 40 ps in contrast to the 100 to 1000 ps of a saturated optical amplifier. As a result, the wavelength converter of the invention is capable of operating at data rates of 10 Gbs and above, as required for advanced optical communications networks.

The difference of the two negative biases $-V_1$, $-V_2$ applied respectively to the two absorption regions 54, 56 of FIG. 3 may be used to control a phase difference between the two Mach-Zehnder interferometric arms 36, 38. The wavelength converter may be operated in two different modes, inverting and non-inverting. In the inverting mode, a bright optical signal is converted to a dark optical signal and vice versa. The inverting mode is obtained when the phases between the two interferometric arms 36, 38 do not differ ($V_1=V_2$) or differ by a multiple of $2\pi$. The conversion occurs because in the absence of an $\lambda_1$ optical data signal, the two components of the $\lambda_2$ optical probe signal exit the two arms 36, 38 in phase and constructively combine to produce a bright output for a dark input. Operation in non-inverting mode is preferred for logical operational reasons. Furthermore, non-inversion reduces the effect of laser chirp. The non-inverting mode is obtained when the phases of the two arms 36, 38 differ by $\pi$ or an odd multiple thereof. On the other hand, in the inverting mode, for which the phase difference is zero or an even multiple of $\pi$, there is no conversion between bright and dark signals.

In an example to be described below, the waveguide core away from the absorbers but including the semiconductor optical amplifiers is chosen to have a photo luminescence wavelength (band gap) of 1650 nm to allow amplification in the 1525 to 1575 nm signal bandwidth typically used in long-haul fiber communications networks. However, the composition of the waveguide core in the absorbing region is chosen to have a band gap of 1250 nm so as to place the 1525–1575 nm carrier band in the flattened absorption tail. Other absorber band gap wavelengths are possible, for example, in the range of 1000 to 1450 nm, that is about 67% to 90% of the center of the carrier band. If only the longer wavelength portion of the carrier band is used, the absorber band gap wavelength may extend to 1550 nm as long as the absorber band gap wavelength is shorter than any carrier wavelength. Expressed slightly differently, for InGaAsP lattice matched to InP, the absorber composition and band gap preferably correspond to 1.0 Q to 1.55 Q.

Returning to FIG. 3, the absorption regions 54, 56 require relatively low power, about one-tenth that of a saturated amplifier. Accordingly, it is possible to integrate further elements on the chip 32. A tunable semiconductor diode laser 60 can be included which can produce the $\lambda_2$ probe signal where the lasing wavelength $\lambda_2$ can be selected to be any wavelength within the operating band, for example, between 1525 to 1575 nm. The cited patent application provides an example of such a tunable diode laser, which can be integrated with other elements on the InP chip 32. Advantageously, such a laser can be switched between wavelengths in about 1 ns. Such fast tuning allows optical switching of optical packets without the need for opto-electronic conversion or prolonged storage of optical signals. A relatively short optical fiber may provide sufficient signal delay to allow both decoding the packet header to determine a destination address for the packet and accordingly retuning the laser wavelength to correspond to the packet destination. For the 1525–1575 nm, the waveguide core both in the passive waveguides and in the laser and amplifying regions can have a quaternary composition InGaAsP latticed matched to InP with a photo luminescence peak of 1650 nm.

The wavelength converter 50 of FIG. 3 is designed so that the $\lambda_1$ optical data signal and the $\lambda_2$ probe signal counter-propagate through the absorption region 54. Counter-propagation reduces the need for filters and isolators. However, the tunable laser 60 may need to be isolated from the $\lambda_1$ radiation exiting the Mach-Zehnder interferometer. However, the need is reduced relative to a wavelength converter using a semiconductor optical amplifier since the $\lambda_1$ radiation is partially absorbed rather than amplified. With proper isolation or filtering, co-propagation (propagation in the same direction) of the two signals $\lambda_1$, $\lambda_2$ through the absorption region 54 will be effective at converting wavelength.

Further, it may be desired to include a semiconductor optical amplifier 62 to amplify the $\lambda_1$ signal before it enters the Mach-Zehnder interferometer. Its gain region is similar to that of the $\lambda_2$ probe laser 60. Such an optical amplifier 62 has a length of about 50 μm, compared to the 300 μm of the two saturated optical amplifiers of FIG. 1, and thus consumes much less power. In view of the reduced power, either one or both of the probe laser 60 and the semiconductor optical amplifier 62 may be integrated on the same chip 50 as the Mach-Zehnder. If both are included, the result is a two-port wavelength converter converting an optical data signal with a carrier at $\lambda_1$ to an optical data signal with a carrier at $\lambda_2$.

Figure 5:
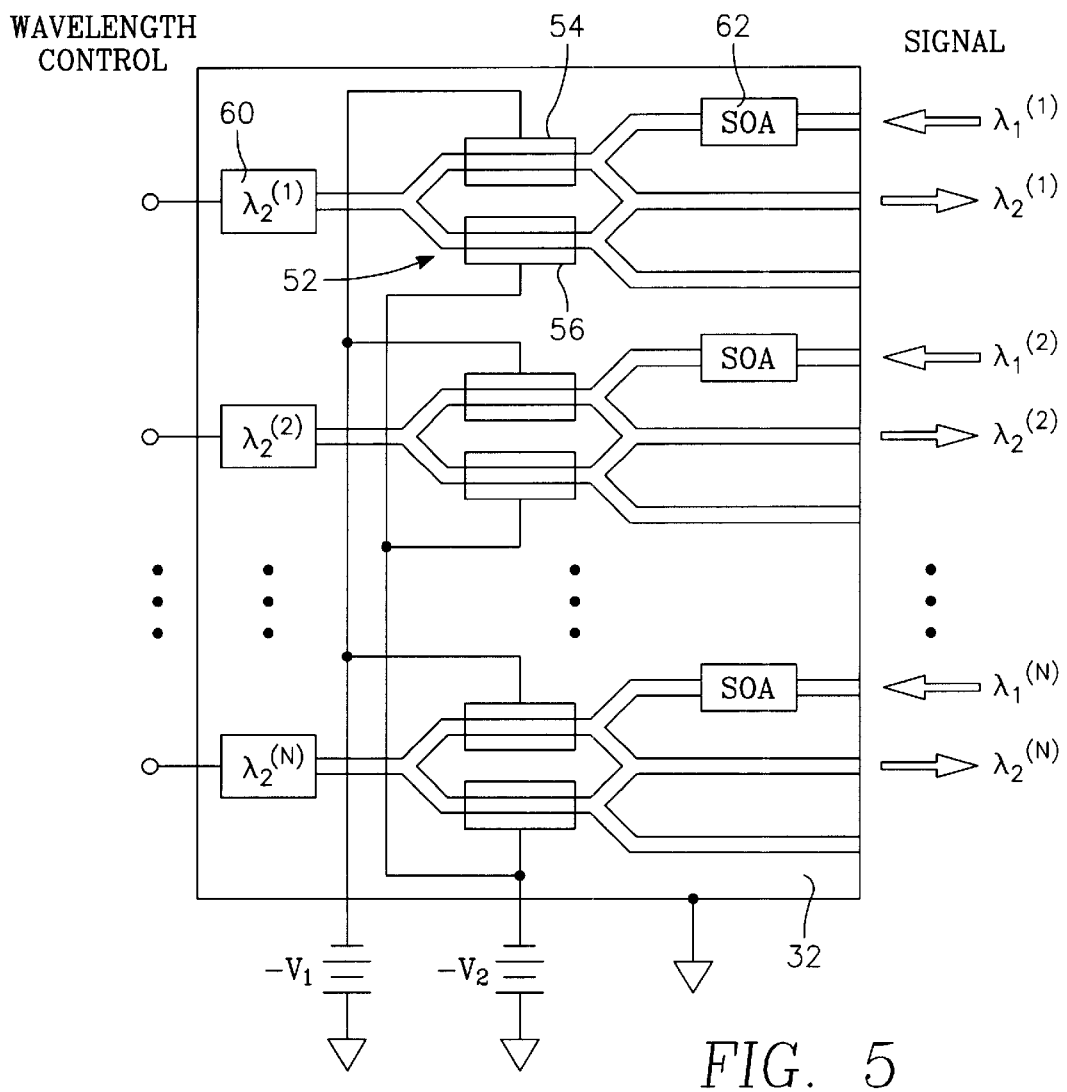
FIG. 5 is a schematic of an opto-electronic chip integrating a large number of interferometers and associated elements configured for a wavelength division multiplexing communication system.

The serial integration described above is particularly useful in avoiding costly pigtails between sections. Furthermore, the low power consumption allows multiple wavelength converters to be integrated onto a single chip. As illustrated in the schematic diagram of FIG. 5, a single InP opto-electronic chip 32 includes N sections, N>1, each preferably including a tunable semiconductor laser 60, a Mach-Zehnder interferometer 52 with reversed biased absorption regions 54, 56, and a semiconductor optical amplifier 62. Each section (i) receives a signal at wavelength $\lambda_1^{(i)}$ and outputs a signal at wavelength $\lambda_2^{(i)}$. The replicated sections have the same design and differ only in the separate control lines for selecting the tuned wavelength $\lambda_2^{(i)}$ and in the anticipation that the input wavelengths will differ between the sections. However, it should be noted that in the output wavelength converters, the wavelengths input to them from the wavelength router may in some designs be the same as long as the wavelengths output from the wavelength converters differ, typically in fixed relationships, before their signals are multiplexed together. The degree of integration may be lesser or greater than that illustrated in FIG. 5. For example, the lasers 60 and/or optical amplifiers 62 may be located off-chip. On the other hand, it would be advantageous to incorporate the demultiplexer 16 or multiplexer 24 of FIG. 1 into the chip 32 of FIG. 5. If desired, the entire circuit of FIG. 1 may be integrated on a single chip.

Figure 6:
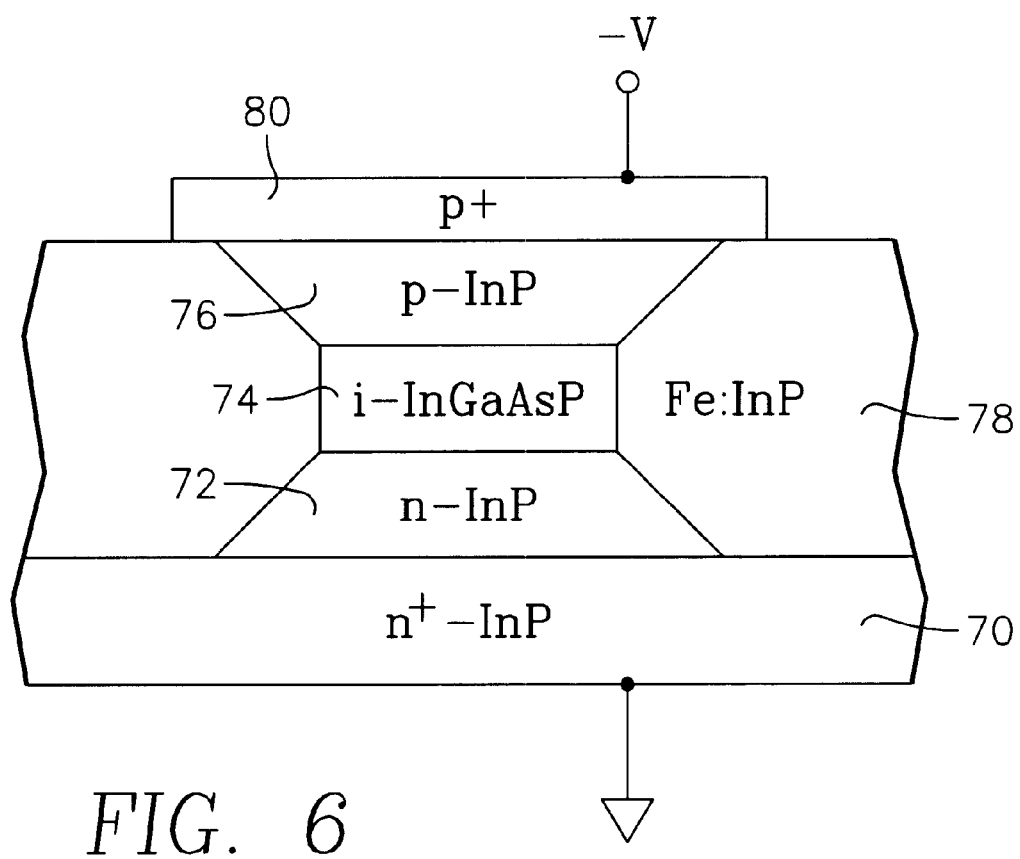
FIG. 6 is a schematic cross-sectional view of a model of the optical waveguide used with the invention.

A simplified example of an avalanche absorber is illustrated in the axial cross-sectional view of FIG. 6. A buried heterostructure waveguide structure is grown on a heavily doped n-type InP substrate. The waveguide, which is single-mode throughout the 1525–1575 nm band, includes a lower cladding layer 72 of n-type InP, a core layer 74 of intrinsic InGaAsP, and an upper cladding layer 76 of p-type InP. The core layer 74 has a width of about 2 μm, a thickness of about 0.8 μm, and a composition of InGaAsP lattice matched to InP and with a photo luminescence wavelength of about 1250 nm for the absorber. An insulating layer 78 of Fe-doped InP is regrown and provides electrical isolation. A p⁻-type contact 80 is patterned over the p-type upper cladding layer 76 to allow negative biasing with respect to the n-type lower cladding layer 72. The waveguide structure extends perpendicularly to the plane of the illustration, and the semiconductor structure extends vertically so that the waveguided light passes perpendicularly through the junction. The structure for other portions of the active waveguide including the amplifier and laser are similar except for the core composition and the biasing. However, it is preferred that the p-type layers 76, 80 be eliminated for the passive waveguides constituting most of the Mach-Zehnder and the rest of the chip. Instead, the insulating Fe-doped InP layer 78 is regrown also over the top of the i-InGaAsP core layer 74.

A more detailed vertical structure for the avalanche heterostructure waveguide is summarized in TABLE 1.

TABLE 1

| Composition | Thickness (nm) | Doping | Doping Density (cm⁻³) |
|---|---|---|---|
| InP | | p-type | $2 \times 10^{17}$ |
| InP | 20 | undoped | |
| InGaAsP-1.30Q | 600 | undoped | |
| InP | 200 | n-type | $2 \times 10^{17}$ |
| InP | 1000 | n-type | $5 \times 10^{17}$ |
| InP | substrate | n-type | $5 \times 10^{17}$ |

The InP substrate is epitaxially deposited with the next four layers. The active layer is the undoped quaternary InGaAsP latticed matched to InP and having a photo luminescence peak at 1.3 μm, hence the notation 1.30 Q for the InGaAsP composition. The top p-type layer is overgrown after the lateral definition of the waveguide. As a result, both the cladding layers are doped to form a diode structure that can be reversed biased.

A highly efficient vertical structure for the semiconductor optical amplifier is summarized in TABLE 2 with the structure for one period of the six-period multi-quantum well (MQW) region summarized in TABLE 3. The quantum wells are strained.

TABLE 2

| Composition | Thickness (nm) | Doping | Doping Density (cm⁻³) |
|---|---|---|---|
| InP | | p-type | $2 \times 10^{17}$ |
| InGaAsP-1.15Q | 75 | undoped | |
| InGaAsP-1.25Q | 23 | undoped | |
| 6-period MQW | | undoped | |
| InGaAsP-1.25Q | 30 | undoped | |
| InGaAsP-1.15Q | 75 | undoped | |
| InP | 200 | n-type | $2 \times 10^{17}$ |
| InP | 1000 | n-type | $5 \times 10^{17}$ |
| InP | substrate | n-type | $5 \times 10^{17}$ |

TABLE 3

| Composition | Thickness (nm) | Doping |
|---|---|---|
| InGaAsP-1.25Q | 7 | undoped |
| $In_{0.7}Ga_{0.3}As$ | 2.5 | undoped |

This structure produces a photo luminescence peak under forward bias of 1.56 μm. However, such a structure requires a complicated fabrication process and regrowth because it needs to be combined with the process for forming the avalanche diode.

A vertical growth structure which simplifies fabrication is summarized in the TABLE 4.

TABLE 4

| Composition | Thickness (nm) | Doping | Doping Density (cm$^{-3}$) |
|---|---|---|---|
| InP | 20 | undoped | |
| InGaAsP-1.55Q | 150 | undoped | |
| InP | 20 | n-type | $2 \times 10^{17}$ |
| InGaAsP-1.25Q | 200 | n-type | $1 \times 10^{17}$ |
| InP | 200 | n-type | $2 \times 10^{17}$ |
| InP | 1000 | n-type | $5 \times 10^{17}$ |
| InP | substrate | n-type | $5 \times 10^{17}$ |

The top two layers form the gain layers for the semiconductor optical amplifiers and the laser diode. They are etched away in the parts of the chip in which no optical gain is needed. For the active waveguide regions including the avalanche absorber, an InP layer doped p-type to $2 \times 10^{17}$ cm$^{-3}$ is regrown on both the 20 nm undoped InP layer forming part of the optical gain layer or the 20 nm n-type layer on top of the 1.25 Q InGaAsP layer, which forms the core layer for both the passive waveguide and the avalanche diode.

Another structure is summarized in TABLE 5 in which each of the six MQW periods has the structure previously described in TABLE 3. This structure combines the quantum wells of TABLE 2 producing a photo luminescence peak at 1.56 µm and the simplified processing of TABLE 4. It contains the active quantum well layer, which is stripped in other regions, and the 1.15 Q InGaAsP core layer for both the passive waveguide and the avalanche diode.

TABLE 5

| Composition | Thickness (nm) | Doping | Doping Density (cm$^{-3}$) |
|---|---|---|---|
| InP | | p-type | $2 \times 10^{17}$ |
| InGaAsP-1.25Q | 23 | undoped | |
| 6-period MQW | | undoped | |
| InGaAsP-1.25Q | 30 | undoped | |
| InP | 20 | n-type | $2 \times 10^{17}$ |
| InGaAsP-1.15Q | 300 | n-type | $1 \times 10^{17}$ |
| InP | 200 | n-type | $2 \times 10^{17}$ |
| InP | 1000 | n-type | $5 \times 10^{17}$ |
| InP | substrate | n-type | $5 \times 10^{17}$ |

A modification to the opto-electronic circuit of FIG. 3 flattens the spectral response of the wavelength converter in view of the changing input wavelength $\lambda_1$ expected in the communication network enabled by the invention. In a wavelength converter 50' illustrated schematically in FIG. 7, the $\lambda_1$ optical signal after being amplified in the input semiconductor optical amplifier 62 passes through a coupler to one side of a cross-gain semiconductor optical amplifier 90, which may have the same form as the input semiconducting optical amplifier 62. A fixed-wavelength diode laser 92 emits light at a wavelength $\lambda_3$ into the other end of the cross-gain amplifier 90. As explained with reference to the prior-art wavelength converter of FIG. 1, the cross-gain amplifier 90 is operated in or near saturation with the result that the cross-modulation causes the data signal impressed on the $\lambda_1$ optical signal to be transferred to the $\lambda_3$ optical signal, that is, wavelength conversion. Part of the $\lambda_3$ optical signal then passes through the added optical coupler into the absorption region 54. Just as with the embodiment of FIG. 3, the carrier wavelength of the $\lambda_3$ optical signal is then converted to $\lambda_2$ and output as the $\lambda_2$ optical signal.

Preferably, the $\lambda_3$ wavelength is chosen to be less than the minimum wavelength of the optical network wavelengths, for example, less than 1525 nm.

This design has several advantages. The shorter wavelength $\lambda_3$ is more effectively absorbed in the absorption region 54 although it reduces the cross-gain modulation in the amplifier 90. The fixed wavelength $\lambda_3$ also enables a constant optical power to be input to the absorbing region 54 regardless of the input wavelength $\lambda_1$.

A wavelength-blocking distributed Bragg reflector (DBR) filter 94 tuned to $\lambda_3$ is interposed between the $\lambda_2$ pump laser 60 and the Mach-Zehnder interferometer and replaces a more complicated directional isolator. Similarly, if the $\lambda_3$ probe wavelength is outside of the wavelength range for the $\lambda_1$ input signals, another DBR filter 96 tuned to $\lambda_3$ may be placed between the cross-gain optical amplifier 90 and the input optical amplifier 62 to block the $\lambda_3$ pump signal from the input optical amplifier 62. Isolation of the $\lambda_3$ laser 92 is easier because of its fixed wavelength control.

The use of an intermediate frequency $\lambda_3$ that is out of band from $\lambda_1$ and $\lambda_2$ permits the usage of saturated gain wavelength conversion similar to that of the prior-art wavelength converter 30 of FIG. 2 without the need for complex isolators and closely spaced filtering to keep the signals separated on the input and output.

Figure 7:
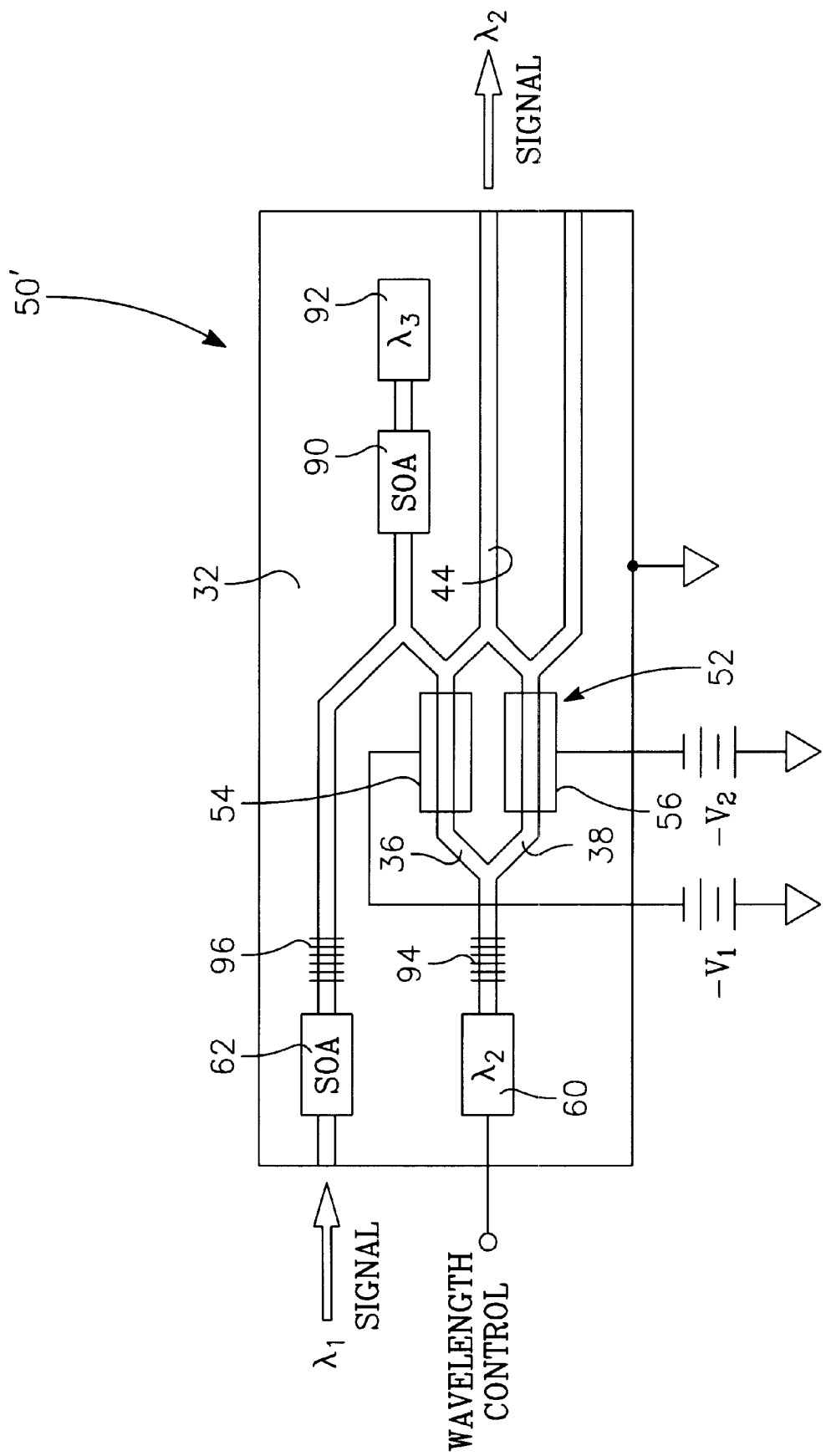
FIG. 7 is a schematic of an opto-electronic chip for wavelength conversion additionally including cross-modulation wavelength conversion to an intermediate wavelength.

It is preferable that the optical switching fabric 10 of FIG. 1 use the wavelength converter 50' of FIG. 7 including cross-gain modulation for the input wavelength converters 18 but use the simpler wavelength converter 50 of FIG. 3 for the output wavelength converters 22. For both converters 50, 50', it is preferred that bias voltages $-V_1, -V_2$ applied to the two absorption regions 54, 56 be set such that both the input and output wavelength converters 18, 22 be operated in the inverting mode with the net result of non-inversion. However, cross-gain wavelength conversion accomplished in the cross-gain optical amplifier 90 of the wavelength converter 50' is itself an inverting operation so that the wavelength conversion accomplished in the Mach-Zehnder portion should be non-inverting so that laser chirp is negative. Similarly, operation of the output wavelength converters 22 in the non-inverting mode reduces the effect of laser chirp. Non-inverting operation provides a negative laser chirp parameter while the fiber chromatic dispersion is positive. Therefore, the combination of the two produces lower net dispersion.

Although the wavelength converter has been described in the context of a Mach-Zehnder interferometer, there are other types of interferometers in which the absorber of the invention may be applied in accomplishing differential phase shift and wavelength conversion.

Although the description above has been provided in the context of a optical router, the wavelength converter of the invention can be used for other purposes. For example, a wavelength cross connect in a fixed-wavelength WDM communication network may be provided with the additional capability of converting carrier wavelengths. Thereby, wavelength assignments may based only on a single leg of the network and need not be coordinated between the legs. Accordingly, wavelength reuse need not be an issue. More particularly, wavelength converters may be placed between different portions of the WDM communication network, thereby simplifying the traffic management within the separate portions. The wavelength converter of the invention also allows WDM wavelength combs to be freely chosen while designing wavelength routers, such as arrayed waveguide gratings, to conform to a single WDM wavelength comb. The converter also reduces the need to register WDM wavelengths between nodes.

The invention thus allows wavelength conversion with switching times of the order of a nanosecond, which is less than a typical packet length, thereby permitting optical routing of signals. The invention also permits the integration of more components on a single chip.

What is claimed is:

1. A wavelength converter, comprising:

an interferometer receiving on a first input port a first optical data signal at a first wavelength and on a second input port a first optical probe signal at a second wavelength and having an output port coupled along a transmission path from said second input port; and a reversed biased semiconductor junction disposed along said transmission path and at least partially absorbing said data signal as it and said probe signal propagate therethrough, thereby exposing said probe signal to a phase shift induced by said data signal.

2. The wavelength converter of claim 1, wherein said junction is biased into avalanche.

3. The wavelength converter of claim 2, wherein said avalanche produces a multiplication factor of at least 10.

4. The wavelength converter of claim 1, wherein said first and second wavelengths are in a range extending from 1525 to 1575 nm.

5. The wavelength converter of claim 4, wherein said semiconductor junction includes an absorbing region composed of InGaAsP having a photo luminescence wavelength of between 1000 and 1550 nm.

6. The wavelength converter of claim 1, wherein said semiconductor junction has a photo luminescence wavelength shorter than said first wavelength.

7. The wavelength converter of claim 1, further comprising a semiconductor optical amplifier integrated on a same opto-electronic chip as said interferometer and said semiconductor junction and positioned to amplify said optical data signal before it enters said interferometer.

8. The wavelength converter of claim 1, further comprising a tunable laser producing said optical probe signal and capable of tuning said second wavelength to a preselected value with a wavelength band.

9. The wavelength converter of claim 8, wherein said wavelength band extends from 1520 to 1575 nm.

10. The wavelength converter of claim 8, wherein said tunable laser is integrated on a same opto-electronic chip as said interferometer.

11. The wavelength converter of claim 1, further comprising:

a laser producing a second probe signal at said first wavelength; and a semiconductor amplifier receiving said second probe signal and a third optical data signal at a third wavelength and producing said first optical data signal through an interaction of said second probe signal and said third optical data signal.

12. The wavelength converter of claim 11, wherein said first wavelength is less than either of said second and third wavelengths.

13. A wavelength converter, comprising:

a Mach-Zehnder interferometer having a first arm and a second arm;

a first input port for an optical data signal coupled to said first arm but not to said second am;

a second input port for an optical probe signal coupled to said first and second arm and configured to cause said data signal and said probe signal to propagate through said first arm;

an output port receiving a combined output of said first and second arms on a same side of said Mach-Zehnder interferometer as said first input port; and a first reversed biased semiconductor junction interposed on said first arm.

14. The wavelength converter of claim 13, wherein said data signal and said probe signal counter-propagate through said first arm.

15. The wavelength converter of claim 13, further comprising a second reversed biased semiconductor junction interposed on said second arm.

16. The wavelength converter of claim 15, wherein said first and second junctions are biased into respective avalanches.

17. The wavelength converter of claim 16, wherein said avalanches have multiplication factors of at least 10.

18. The wavelength converter of claim 13, wherein said optical data signal is impressed on a first optical carrier at a first wavelength and said optical probe signal has a second wavelength.

19. The wavelength converter of claim 18, wherein said first and second wavelengths are in a range extending from 1525 to 1575 nm.

20. The wavelength converter of claim 19, wherein said first semiconductor junction includes an absorbing region composed of InGaAsP having a photo luminescence wavelength of between 1000 and 1550 nm.

21. The wavelength converter of claim 18, wherein said first semiconductor junction has a photo luminescence wavelength shorter than said first wavelength.

22. The wavelength converter of claim 13, further comprising a tunable laser integrated on a same opto-electronic chip as said Mach-Zehnder interferometer and said first semiconductor junction and capable of producing said optical probe signal at a selectable wavelength within a wavelength range.

23. The wavelength converter of claim 13, further comprising a semiconductor optical amplifier integrated on a same opto-electronic chip as said Mach-Zehnder interferometer and said first semiconductor junction and positioned between said first input port and said first arm to amplify said optical data signal.

24. A wavelength converter, comprising:

an interferometer receiving on a first input port a first optical signal having a carrier signal at a first optical wavelength and on a second input port a second optical signal at a second optical wavelength and having an output port coupled along a transmission path from said second input port; and a semiconductor junction disposed along said transmission path and having a photo luminescence wavelength shorter than said first and second optical wavelengths, said first and second optical signals propagating through said semiconductor junction.

25. The wavelength converter of claim 24, wherein said second optical signal is selectively phase shifted according to a data signal impressed upon said first optical signal.

26. The wavelength converter of claim 25, wherein said semiconductor junction includes an absorbing region composed of InGaAsP having a photo luminescence wavelength of between 1000 and 1550 nm.

27. The wavelength converter of claim 24, wherein said first and second wavelengths are in a range extending from 1525 to 1575 nm.

* * * * *